United States Patent
Cong et al.

(10) Patent No.: US 11,781,212 B2
(45) Date of Patent: Oct. 10, 2023

(54) OVERLAP SUSCEPTOR AND PREHEAT RING

(71) Applicant: Applied Materials, Inc., Santa Clara, CA (US)

(72) Inventors: Zhepeng Cong, San Jose, CA (US); Schubert Chu, San Francisco, CA (US); Nyi Oo Myo, San Jose, CA (US); Kartik Bhupendra Shah, Saratoga, CA (US); Zhiyuan Ye, San Jose, CA (US); Richard O. Collins, Santa Clara, CA (US)

(73) Assignee: Applied Material, Inc., Santa Clara, CA (US)

( * ) Notice: Subject to any disclaimer, the term of this patent is extended or adjusted under 35 U.S.C. 154(b) by 92 days.

(21) Appl. No.: 17/224,537

(22) Filed: Apr. 7, 2021

(65) Prior Publication Data
US 2022/0325400 A1 Oct. 13, 2022

(51) Int. Cl.
*C23C 14/24* (2006.01)
*H01L 21/67* (2006.01)
*C23C 14/50* (2006.01)

(52) U.S. Cl.
CPC .............. *C23C 14/24* (2013.01); *C23C 14/50* (2013.01); *H01L 21/67017* (2013.01)

(58) Field of Classification Search
None
See application file for complete search history.

(56) References Cited

U.S. PATENT DOCUMENTS

| | | | | |
|---|---|---|---|---|
| 5,916,369 A * | 6/1999 | Anderson | ......... | C23C 16/45514 118/726 |
| 5,935,334 A * | 8/1999 | Fong | ................. | H01L 21/02129 257/E21.243 |
| 6,019,848 A * | 2/2000 | Frankel | ................. | C23C 16/455 118/715 |
| 6,051,286 A * | 4/2000 | Zhao | ................... | C23C 16/4401 427/253 |
| 6,079,356 A * | 6/2000 | Umotoy | ............ | H01J 37/32449 118/728 |
| 6,106,625 A * | 8/2000 | Koai | ...................... | C23C 16/455 118/724 |
| 6,296,712 B1 * | 10/2001 | Guo | .................. | C23C 16/45521 118/500 |

(Continued)

FOREIGN PATENT DOCUMENTS

| | | |
|---|---|---|
| JP | 2006049503 A | 2/2006 |
| JP | 2021005680 A | 1/2021 |

OTHER PUBLICATIONS

PCT/US2022/021463, International Search Report and Written Opinion dated Jul. 7, 2022, 9 pages.

*Primary Examiner* — Jethro M. Pence
(74) *Attorney, Agent, or Firm* — PATTERSON & SHERIDAN, LLP (57) ABSTRACT

Embodiments disclosed herein generally provide improved control of gas flow in processing chambers. In at least one embodiment, a liner for a processing chamber includes an annular body having a sidewall and a vent formed in the annular body for exhausting gas from inside to outside the annular body. The vent comprises one or more vent holes disposed through the sidewall. The liner further includes an opening in the annular body for substrate loading and unloading.

16 Claims, 5 Drawing Sheets

(56) References Cited

U.S. PATENT DOCUMENTS

| | | | |
|---|---|---|---|
| 6,559,039 B2* | 5/2003 | Wang | C23C 16/45557 257/E21.585 |
| 6,645,884 B1* | 11/2003 | Yang | C23C 16/4412 438/758 |
| 6,946,033 B2* | 9/2005 | Tsuei | C23C 16/45565 118/724 |
| 7,520,957 B2* | 4/2009 | Kao | H01J 37/3244 156/345.43 |
| 7,767,024 B2* | 8/2010 | Kao | H01L 21/02104 438/715 |
| 7,942,969 B2* | 5/2011 | Riker | H01J 37/32477 118/715 |
| 8,343,307 B2* | 1/2013 | Huston | H01J 37/32862 156/345.43 |
| 8,372,203 B2* | 2/2013 | Chacin | C23C 16/481 118/724 |
| 8,846,163 B2* | 9/2014 | Kao | C23C 14/50 134/4 |
| 9,553,002 B2* | 1/2017 | Samir | C23C 16/45519 |
| 9,842,748 B2* | 12/2017 | Samir | H01L 21/67017 |
| 9,957,617 B2* | 5/2018 | Kuh | C23C 16/481 |
| 10,170,342 B2* | 1/2019 | Samir | H01L 21/67115 |
| 10,184,178 B2* | 1/2019 | Kim | C23C 16/505 |
| 10,204,818 B2* | 2/2019 | Zhang | H01L 21/68728 |
| 10,347,475 B2* | 7/2019 | Scheible | H01J 37/3488 |
| 10,358,715 B2* | 7/2019 | Kaufman-Osborn | H01L 21/67196 |
| 10,593,539 B2* | 3/2020 | Kao | H01J 37/32862 |
| 10,622,224 B2* | 4/2020 | She | H01J 37/32458 |
| 10,784,089 B2* | 9/2020 | Rogers | H01J 37/32724 |
| 10,793,951 B2* | 10/2020 | Tzu | C23C 16/4586 |
| 10,796,889 B2* | 10/2020 | Ishikawa | H01J 37/32724 |
| 10,998,172 B2* | 5/2021 | Lavitsky | C23C 14/34 |
| 11,032,945 B2* | 6/2021 | Oki | H05K 7/20409 |
| 11,037,763 B2* | 6/2021 | Sugawara | H01J 37/32 |
| 11,062,885 B2* | 7/2021 | Sim | H01J 37/32642 |
| 11,177,144 B2* | 11/2021 | Lau | B23K 26/0648 |
| 11,208,725 B2* | 12/2021 | Mizunaga | H01L 21/6838 |
| 11,232,933 B2* | 1/2022 | Rogers | H01J 37/32642 |
| 11,239,063 B2* | 2/2022 | Fujii | H01L 21/285 |
| 11,273,464 B2* | 3/2022 | Shimmura | B05B 14/30 |
| 11,289,312 B2* | 3/2022 | Allen | C23C 14/541 |
| 11,319,627 B2* | 5/2022 | Fujii | H01J 37/32651 |
| 11,380,524 B2* | 7/2022 | Perry | H01J 37/3244 |
| 11,430,640 B2* | 8/2022 | Jeong | C23C 16/50 |
| 11,443,926 B2* | 9/2022 | Jeong | C23C 16/4412 |
| 2004/0144323 A1 | 7/2004 | Kai | |
| 2005/0221552 A1* | 10/2005 | Kao | H01L 21/02104 438/200 |
| 2005/0230350 A1* | 10/2005 | Kao | H01J 37/32862 438/715 |
| 2009/0095621 A1* | 4/2009 | Kao | C23C 14/50 204/298.31 |
| 2009/0111280 A1* | 4/2009 | Kao | H01J 37/32541 257/E21.24 |
| 2010/0055351 A1* | 3/2010 | Kato | C23C 16/45563 118/712 |
| 2011/0223755 A1* | 9/2011 | Kao | H01L 21/67069 438/585 |
| 2012/0034369 A1* | 2/2012 | Ito | G03F 7/16 118/712 |
| 2012/0103263 A1 | 5/2012 | Myo et al. | |
| 2012/0263875 A1 | 10/2012 | Brenninger et al. | |
| 2013/0036968 A1* | 2/2013 | Suzuki | C30B 25/12 118/712 |
| 2014/0076234 A1* | 3/2014 | Kao | H01J 37/32082 118/719 |
| 2014/0083360 A1* | 3/2014 | Samir | C30B 25/08 118/715 |
| 2014/0261159 A1 | 9/2014 | Okabe et al. | |
| 2016/0020086 A1* | 1/2016 | Tsai | H01L 21/68742 118/712 |
| 2016/0068959 A1* | 3/2016 | Lau | H01L 21/6719 118/715 |
| 2016/0068996 A1 | 3/2016 | Lau et al. | |
| 2016/0348275 A1 | 12/2016 | Oki et al. | |
| 2020/0006054 A1* | 1/2020 | Kao | H01J 37/32082 |
| 2020/0102654 A1* | 4/2020 | Mizunaga | H01L 21/67248 |
| 2021/0015004 A1 | 1/2021 | Oki et al. | |
| 2021/0225640 A1* | 7/2021 | Kao | H01J 37/32541 |
| 2021/0319989 A1* | 10/2021 | Chong | C23C 14/50 |
| 2021/0388501 A1* | 12/2021 | Choi | C23C 16/4412 |
| 2022/0165553 A1* | 5/2022 | Noorbakhsh | H01J 37/32715 |
| 2022/0349088 A1* | 11/2022 | Cong | C23C 16/46 |

* cited by examiner

OVERLAP SUSCEPTOR AND PREHEAT RING

BACKGROUND

Field

Embodiments of the present disclosure generally relate to gas flow in processing chambers. More particularly, embodiments disclosed herein relate to an overlapping susceptor and preheat ring, vented liner, and chamber pressure balancing.

Description of the Related Art

Semiconductor substrates are processed for a wide variety of applications, including the fabrication of integrated devices and micro-devices. One method of substrate processing includes depositing a material, such as a dielectric material or a conductive metal, on an upper surface of the substrate. For example, epitaxy is a deposition process that grows a thin, ultra-pure layer, usually of silicon or germanium on a surface of a substrate. The material may be deposited in a lateral flow chamber by flowing a process gas parallel to the surface of a substrate positioned on a support, and thermally decomposing the process gas to deposit a material from the process gas onto the substrate surface. Film quality in epitaxial growth depends on the precision of gas flow during film deposition. For example, purge gas flow within a lower portion of the chamber may be used to help prevent or reduce the flow of process gas or diffusion of process gas into the lower portion. However, gas exchange between the process gas flow and purge gas flow may be detrimental to the deposition process.

Therefore, there is a need for improved control of gas flow in processing chambers.

SUMMARY

Embodiments of the present disclosure generally relate to gas flow in processing chambers. More particularly, embodiments disclosed herein relate to an overlapping susceptor and preheat ring, vented liner, and chamber pressure balancing.

In at least one embodiment, a liner for a processing chamber includes an annular body having a sidewall and a vent formed in the annular body for exhausting gas from inside to outside the annular body. The vent comprises one or more vent holes disposed through the sidewall. The liner further includes an opening in the annular body for substrate loading and unloading.

In at least one embodiment, an assembly for a processing chamber includes a susceptor having a substrate-receiving top surface, a liner radially outwardly surrounding a first volume below a plane of the susceptor, and a preheat ring coupled to and extending radially inwardly from the liner and radially overlapping the susceptor.

In at least one embodiment, a processing chamber includes a chamber body having a susceptor and a preheat ring disposed therein. The chamber body includes an upper chamber volume defined above a plane of the susceptor and a lower chamber volume defined below the plane of the susceptor. Portions of the susceptor and preheat ring are radially overlapping. The processing chamber includes a first exhaust port disposed through a sidewall of the chamber body for exhausting process gas from the upper chamber volume. The processing chamber includes a second exhaust port disposed through the sidewall of the chamber body for exhausting purge gas from the lower chamber volume. The processing chamber includes a differential pressure sensor configured to measure a pressure differential between the upper chamber volume and lower chamber volume. The processing chamber includes a pressure balancing valve configured to fluidly couple the first and second exhaust ports to a vacuum source. The pressure balancing valve is operable to regulate the pressure differential between the upper chamber volume and lower chamber volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to gas flow in processing chambers. More particularly, embodiments disclosed herein relate to an overlapping susceptor and preheat ring, vented liner, and chamber pressure balancing.

Embodiments disclosed herein provide improved control of gas flow in processing chambers, particularly processing chambers having process gas flow in an upper portion of the chamber and purge gas flow in a lower portion of the chamber. Embodiments disclosed herein provide an overlapping susceptor and preheat ring which reduces or prevents gas exchange between the process gas flow in the upper portion and purge gas flow in the lower portion compared to conventional apparatus in which a gap between the susceptor and preheat ring enables gas exchange therebetween.

Embodiments disclosed herein reduce or prevent purge gas flow into the upper portion of the chamber, which helps prevent dilution of the process gas flow which can be detrimental to deposition processes. Some deposition processes use a low flow of main carry gas to maintain high precursor partial pressure, for example to achieve a high dopant level during film formation. During such processes, high purge gas flow to the upper portion dilutes the process gas flow which may necessitate a reduction of main carry gas flow. Reduction of main carry gas flow to an undesirably low level results in poor deposition uniformity including poor deposition uniformity tuning with rotation. In addition, purge gas flow introduces particles (e.g., metal particles) to the upper portion with detrimental impacts on defect performance.

Embodiments disclosed herein reduce or prevent process gas flow into the lower portion of the chamber, which helps prevent undesirable material deposition on surfaces in the lower portion. For example, the process gas may be prevented from contacting and causing film deposition on one or both of a back side of the susceptor or a lower window, either of which may result in process shift leading to undesirable changes in film thickness, dopant level, and defect formation. Prevention of material deposition in the lower portion of the chamber increases tool uptime by extending preventative maintenance intervals associated with cleaning.

Embodiments disclosed herein provide a vented liner which enables exhaust of the purge gas flow directly from the lower portion of the chamber in contrast to conventional liners without venting in which the purge gas flow is mixed with the process gas and exhausted from the upper portion of the chamber. Direct venting of purge gas flow from the lower portion of the chamber improves deposition process uniformity and tool uptime according to the mechanisms outlined above.

Embodiments disclosed herein provide dynamic pressure balancing between the upper and lower portions of the chamber in contrast to conventional processing chambers in which pressure is controlled passively based at least in part on process gas flow input, purge gas flow input, and gap size between the susceptor and the preheat ring. Dynamic pressure balancing improves deposition process uniformity and tool uptime according to the mechanisms outlined above.

Figure 1A:
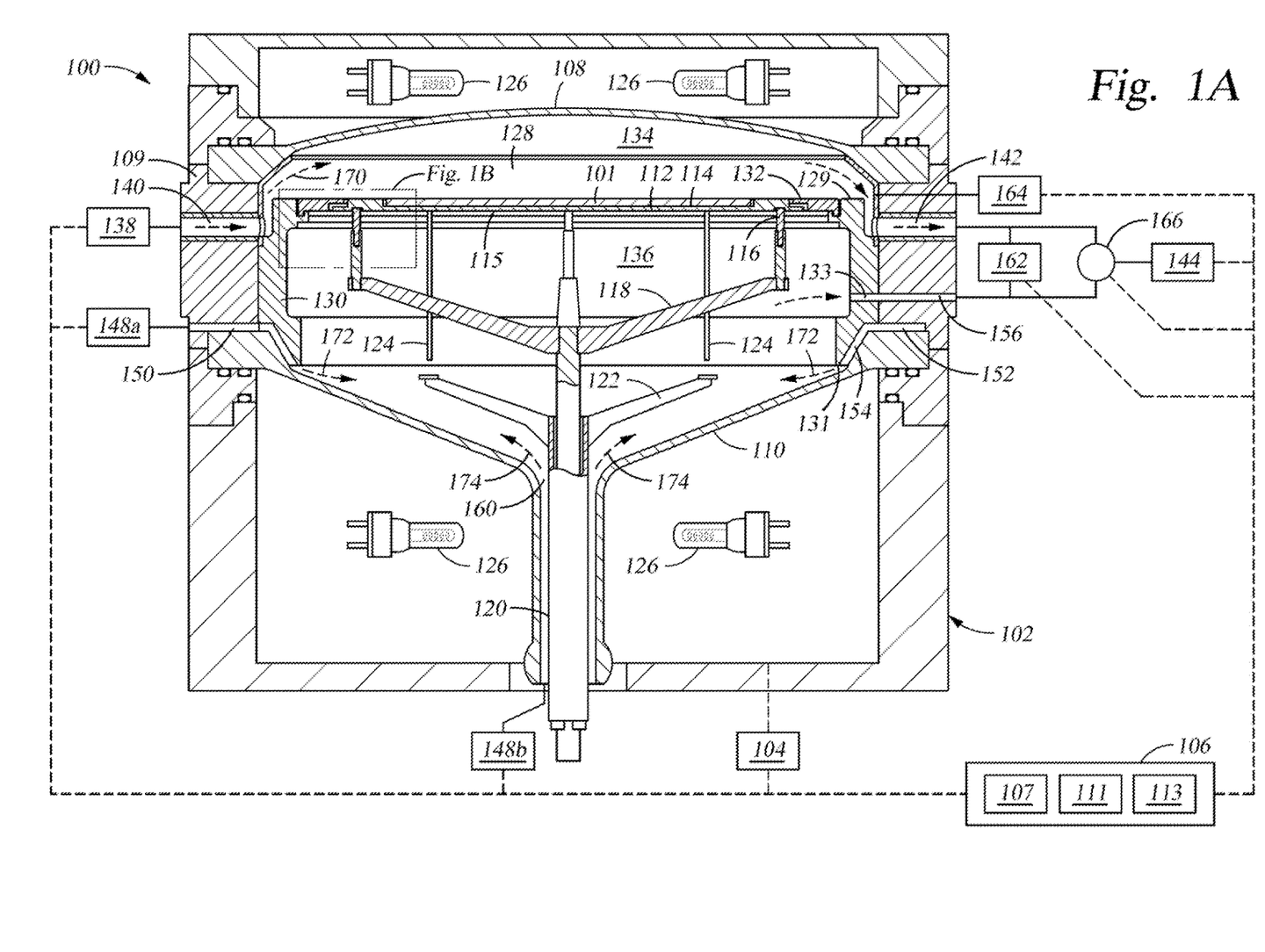
FIG. 1A is a schematic cross-sectional view of a processing chamber, according to at least one embodiment.

FIG. 1A is a schematic cross-sectional view of a processing chamber 100. The processing chamber 100 may be used to process one or more substrates 101, including the deposition of a material on an upper surface of the substrate 101. For example, the processing chamber 100 may be adapted to perform an epitaxial deposition process. In one example, the processing chamber 100 may be configured to process a 300 mm substrate.

The processing chamber 100 generally includes a chamber body 102, support systems 104, and a controller 106. The support systems 104 may include components for monitoring and/or executing one or more processes performed using the processing chamber 100, such as film deposition. The controller 106, such as a programmable computer, is coupled to the support systems 104 and is adapted to control the processing chamber 100 and support systems 104. The controller 106 includes a programmable central processing unit (CPU) 107 which is operable with a memory 111 (e.g., non-volatile memory) and support circuits 113. The support circuits 113 are conventionally coupled to the CPU 107 and comprise cache, clock circuits, input/output subsystems, power supplies, and the like, and combinations thereof coupled to the various components of the processing chamber 100.

In some embodiments, the CPU 107 is one of any form of general purpose computer processor used in an industrial setting, such as a programmable logic controller (PLC), for controlling various monitoring system component and subprocessors. The memory 111, coupled to the CPU 107, is non-transitory and is typically one or more of readily available memory such as random access memory (RAM), read only memory (ROM), floppy disk drive, hard disk, or any other form of digital storage, local or remote.

Herein, the memory 111 is in the form of a computer-readable storage media containing instructions (e.g., non-volatile memory), that when executed by the CPU 107, facilitates the operation of the processing chamber 100. The instructions in the memory 111 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The chamber body 102 has an upper window 108, e.g., a dome, a side wall 109 and a lower window 110, e.g., dome, defining a processing region. A susceptor 112 used for supporting a substrate 101 is disposed in the processing region. The susceptor 112 may be formed from silicon carbide or graphite coated with silicon carbide. The susceptor 112 has a substrate-receiving top surface 114. The susceptor 112 is rotated and supported by support posts 116, which are coupled to respective supporting arms 118 that extend from a shaft 120. During operation, the substrate 101 disposed on the susceptor 112 may be raised relative to the susceptor 112 by substrate lift arms 122 through lift pins 124.

The internal volume of the processing chamber 100 is divided into an upper chamber volume 134 (e.g., a process gas region) above a plane of the susceptor 112 and a lower chamber volume 136 (e.g., a purge gas region) below the plane of the susceptor 112.

The processing chamber 100 includes an array of radiant heat lamps 126 for heating, among other components, a back side 115 of the susceptor 112 and a preheat ring 132 (described in more detail below). Heating of the susceptor 112 and preheat ring 132 contributes to thermal decomposition of process gases onto the substrate 101 to form one or more layers on the substrate 101. The radiant heat lamps 126 may be disposed above the upper window 108, below the lower window 110, or both, as shown in FIG. 1A. The upper window 108 and lower window 110 may be formed from an optically transparent material, such as quartz, to facilitate transmission of thermal radiation therethrough.

The radiant heat lamps 126 may be arranged in any desired manner around the susceptor 112 to independently control the temperature at various regions of the substrate 101 in order to facilitate the deposition of a material onto the upper surface of the substrate 101. While not discussed here in detail, the deposited material may include silicon germanium, gallium arsenide, gallium nitride, or aluminum gallium nitride, among others. The thermal energy output of each of the radiant heat lamps 126 may be precisely controlled using the controller 106. The radiant heat lamps 126 may be configured to heat the interior of the processing chamber 100 to a temperature within a range of about 200° C. to about 1600° C.

A reflector may be optionally placed above the upper window 108 to reflect infrared light that is radiating off the substrate 101 back onto the substrate 101. The reflector may be fabricated from a metal such as aluminum or stainless steel. The efficiency of the reflection can be improved by coating a reflector area with a highly reflective coating such as with gold. The reflector may be coupled to a cooling source for providing a cooling fluid such as water to the reflector for cooling the reflector.

An upper liner 128 is disposed below the upper window 108 and is configured to prevent unwanted deposition onto chamber components, such as the sidewall 109 or a peripheral portion of the upper window 108. The upper liner 128 is positioned adjacent to a lower liner 130. The lower liner 130 is configured to fit inside an inner circumference of the sidewall 109. The lower liner 130 is disposed between the upper window 108 and lower window 110. The lower liner 130 radially outwardly surrounds the lower chamber volume 136. The upper liner 128 and lower liner 130 may be formed from quartz.

A preheat ring 132 is coupled to the lower liner 130 for supporting and positioning the preheat ring 132. An upper end 129 of the lower liner 130 has a profile for receiving the preheat ring 132 thereon. The preheat ring 132 is configured to be disposed around the periphery of the susceptor 112 when the susceptor 112 is in a processing position as shown in FIG. 1A. The preheat ring 132 extends radially inwardly from the lower liner 130. Radially overlapping portions of the preheat ring 132 and the susceptor 112 are configured to reduce or prevent gas exchange between the upper chamber volume 134 and lower chamber volume 136 as described in more detail below. The preheat ring 132 may be formed from silicon carbide. The temperature of the preheat ring 132 during operation may be within a range of about 100° C. to about 800° C. The heated preheat ring 132 helps to activate process gases flowing through the upper chamber volume 134.

Process gas supplied from a process gas supply source 138 is introduced into the upper chamber volume 134 through a process gas inlet 140 formed through the sidewall 109. The process gas inlet 140 extends at least partially between the upper liner 128 and lower liner 130. The process gas inlet 140 is configured to direct the process gas in a generally radially inward direction as indicated by process gas flow 170. During film formation, the susceptor 112 may be located in a processing position (shown in FIG. 1A), which is adjacent to and at about the same elevation as a terminus of the process gas inlet 140, which allows the process gas to flow in a generally planar, laminar condition along a flow path defined at least in part across an upper surface of the substrate 101. While only one process gas inlet 140 is shown, the process gas inlet 140 may include two or more inlets for delivering two or more individual process gas flows having different composition, concentration, partial pressure, density, and/or velocity.

The process gas exits the upper chamber volume 134 through an exhaust port, such as process gas outlet 142, formed through the sidewall 109 of the processing chamber 102 opposite the process gas inlet 140. Exhaust of the process gas through the process gas outlet 142 is facilitated by a vacuum source, such as vacuum pump 144, fluidly coupled to a downstream side of the process gas outlet 142.

Purge gas is supplied from one or more purge gas sources 148a and/or 148b to the lower chamber volume 136. The purge gas sources 148a and 148b may be the same source or different sources as shown. The purge gas may be an inert gas, such as hydrogen or nitrogen. The flow of purge gas in the lower chamber volume 136 helps prevent or reduce the flow of process gas or diffusion of process gas from the upper chamber volume 134 to the lower chamber volume 136. The flow of purge gas enters the lower chamber volume 136 through one or both of a side inlet 150 formed in or around the sidewall 109 or a bottom inlet 160 formed in the lower window 110. The side inlet 150 is disposed at an elevation below the process gas inlet 140. A distribution channel 152 is formed radially between the lower liner 130 and the sidewall 109 and vertically between the sidewall 109 and the lower window 110. The distribution channel 152 is fluidly coupled to the side inlet 150 for receiving purge gas from the side inlet 150. The distribution channel 152 may extend 360° around the lower liner 130 for distributing purge gas evenly around the lower chamber volume 136. The distribution channel 152 is fluidly coupled to the lower chamber volume 136 through a second channel 154. The second channel 154 shown is formed between the lower liner 130 and the lower window 110. The second channel 154 extends radially inwardly towards a lower end 131 of the lower liner 130. Alternatively, the second channel 154 may be formed through a body of the lower liner 130. The second channel 154 may be formed as a single annular channel or a plurality of arc-shaped channels. The second channel 154 is disposed at an elevation below the process gas inlet 140. The second channel 154 shown is also disposed at an elevation below the distribution channel 152. Alternatively, the second channel 154 may be disposed at or above the distribution channel 152. The second channel 154 is configured to direct the purge gas into the lower chamber volume 136 in a generally radially inward direction as indicated by purge gas flow 172.

The upper chamber volume 134 is defined vertically above the plane of the susceptor 112 (e.g., above the substrate-receiving surface 114 thereof or above a substrate 101 disposed thereon) and the preheat ring 132, defined vertically below the upper window 108, and defined radially inwardly of the sidewall 109. The lower chamber volume 136 is defined vertically below the plane of the susceptor 112 (e.g., below the back side 115 thereof), defined vertically above the lower window 110, and defined radially inwardly of the lower liner 130.

In a substrate loading position, the susceptor 112 is lowered relative to the preheat ring 132 to provide a vertical gap between the radially overlapping portions of the susceptor 112 and preheat ring 132. A substrate 101 is configured to be loaded into the chamber body 102 and unloaded from the chamber body 102 through the gap and through a corresponding opening in the lower liner 130 (shown in FIG. 2A). In the processing position (shown in FIG. 1A), the susceptor 112 is raised such that the susceptor 112 and the preheat ring 132 are disposed at an elevation between a terminus of the process gas inlet 140 and a terminus of the second channel 154.

The bottom inlet 160 is disposed between the shaft 120 and the lower window 110. The bottom inlet 160 is directly fluidly coupled to the lower chamber volume 136. The bottom inlet 160 is disposed at an elevation below the second channel 154. The bottom inlet 160 is configured to direct purge gas into the lower chamber volume 136 in a generally upward and radially outward direction as indicated by purge gas flow 174. Purge gas flow 174 from the bottom inlet 160 may be configured to increase the flow of purge gas to a bottom portion of the lower chamber volume 136 compared to purge gas flow 172 alone.

The purge gas exits the lower chamber volume 136 through an exhaust port, such as purge gas outlet 156 formed through the sidewall 109. The purge gas outlet 156 shown is located opposite the process gas inlet 140. However, the purge gas outlet 156 may be located at any radial position along the sidewall 109 with respect to the process gas inlet 140. The lower liner 130 has a vent 133 (described in more detail below) for exhausting purge gas directly from the lower chamber volume 136 and into the purge gas outlet 156. Exhaust of the purge gas through the vent 133 and the purge gas outlet 156 is facilitated by a vacuum source, such as vacuum pump 144, fluidly coupled to a downstream side of the purge gas outlet 156.

A differential pressure sensor 162 is configured to measure a pressure differential between the upper chamber volume 134 and lower chamber volume 136. The differential pressure sensor 162 is coupled to each of the process gas outlet 142 and purge gas outlet 156. The differential pressure sensor 162 shown is disposed in the sidewall 109. Alternatively, the differential pressure sensor 162 may be located outside and adjacent the chamber body 102, such as being coupled to the sidewall 109. Measurement data from the differential pressure sensor 162 is communicated to one or both of the controller 106 and a pressure balancing valve 166 which is described in more detail below.

A pressure sensor 164 is configured to measure a pressure in the upper chamber volume 134. During processing, the pressure in the upper chamber volume 134 may be about 5 Torr to about 600 Torr. The pressure sensor 164 shown is located outside and adjacent the chamber body 102 and coupled to the sidewall 109. Alternatively, the pressure sensor 164 may be disposed in the sidewall 109. The pressure sensor 164 shown is coupled to the upper chamber volume 134 through the sidewall 109 and the upper liner 128. Alternatively, the pressure sensor 164 may be coupled to the upper chamber volume 134 through the upper window 108 or between the upper window 108 and the sidewall 109. Measurement data from the pressure sensor 164 is communicated to one or both of the controller 106 and pressure balancing valve 166. A second pressure sensor may be configured to measure a pressure in the lower chamber volume 136. Measurement data from the second pressure sensor may be communicated to one or both of the controller 106 and pressure balancing valve 166.

The pressure balancing valve 166 fluidly couples each of the process gas outlet 142 and purge gas outlet 156 to the vacuum pump 144. The pressure balancing valve 166 may be operated by the controller 106 based on data from one or both of the differential pressure sensor 162 or pressure sensor 164. In operation, the pressure balancing valve 166 regulates exhaust of the process gas through the process gas outlet 142 and exhaust of the purge gas through the purge gas outlet 156 in order to regulate the pressure differential between the upper chamber volume 134 and lower chamber volume 136. Pressure balancing between the upper chamber volume 134 and lower chamber volume 136 is able to remove the driving force for gas exchange therebetween. A process design tolerance for the pressure differential may be about ±5% or less, such as about ±0.1% to about ±5%, such as about ±2% to about ±5%. In one example, for a pressure of 10 Torr in the upper chamber volume 134, the lower chamber volume 136 may be maintained within a range of about 9.9 Torr to about 10.1 Torr (i.e., tolerance of ±1%). In one example, the pressure balancing valve 166 is operable to maintain the pressure differential between the upper chamber volume 134 and lower chamber volume 136 at about 10% or less, such as about 5% or less, such as about 1% or less.

The pressure balancing valve 166 may be used to bias the pressure differential towards one of the upper chamber volume 134 or lower chamber volume 136. In one example, the pressure balancing valve 166 is operable to maintain the lower chamber volume 136 at a higher pressure than the upper chamber volume 134. Alternatively, the pressure balancing valve 166 may be operable to maintain the lower chamber volume 136 at a lower pressure than the upper chamber volume 134.

Figure 1B:
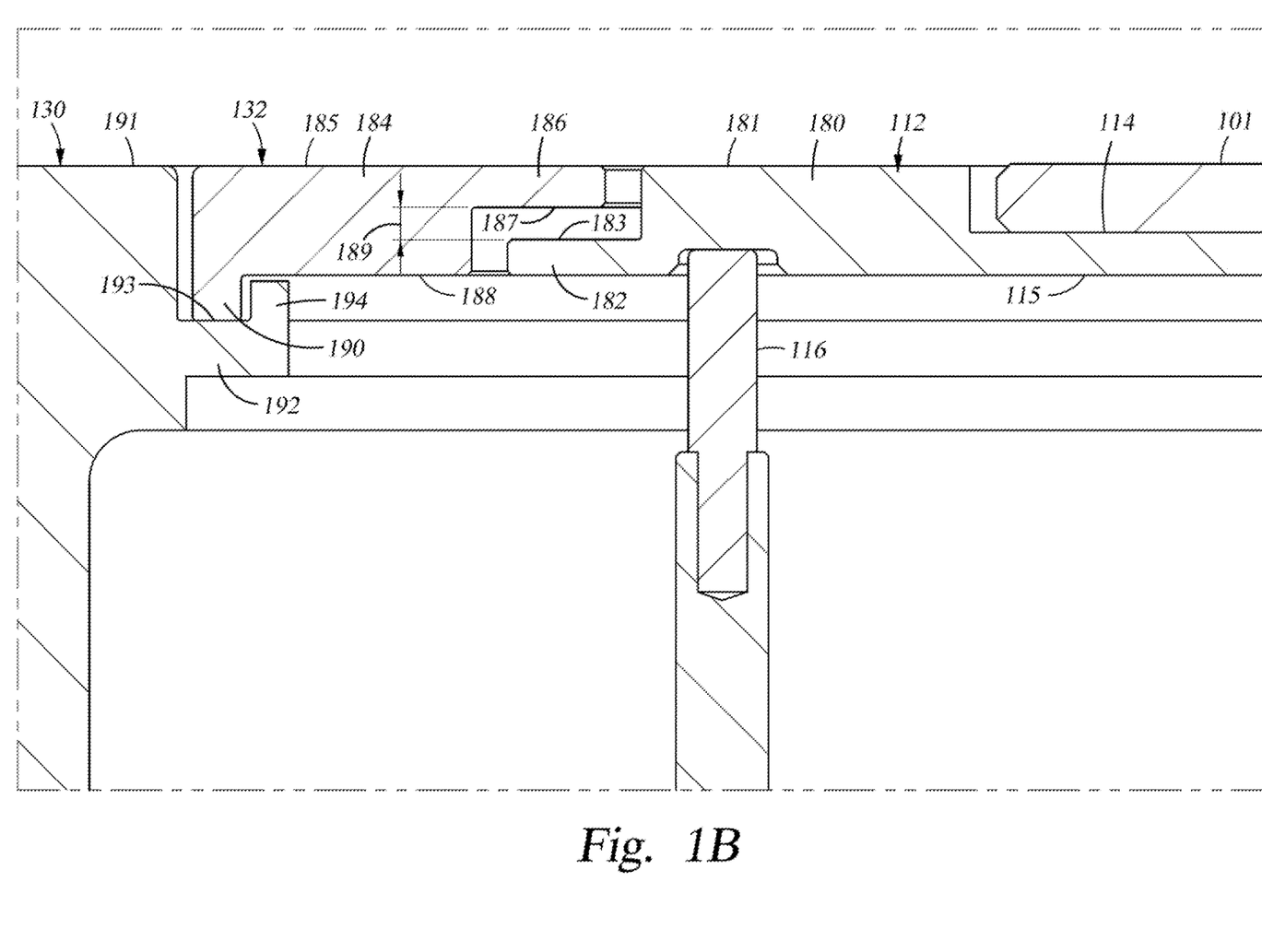
FIG. 1B is an enlarged cross-sectional view of a portion of FIG. 1A.

FIG. 1B is an enlarged cross-sectional view of a portion of FIG. 1A. The susceptor 112 has a raised border 180 radially outwardly surrounding the substrate-receiving top surface 114 of the susceptor 112. The raised border 180 has a top surface 181 facing the upper chamber volume 134. The susceptor 112 has a radially outwardly extending outer flange 182 configured to overlap a corresponding overlapping portion of the preheat ring 132 as described in more detail below. The outer flange 182 extends radially outwardly in relation to the raised border 180. A top surface 183 of the outer flange 182 is recessed below the top surface 181 of the raised border 180.

A body 184 (e.g., an annular body) of the preheat ring 132 has a top surface 185 facing the upper chamber volume 134. The top surface 185 of the preheat ring 132 is coplanar with the top surface 181 of the susceptor 112. The body 184 of the preheat ring 132 has a radially inwardly extending inner flange 186 configured to overlap the outer flange 182 of the susceptor 112. A lower surface 187 of the inner flange 186 is recessed (from below) above a lower surface 188 of the body 184. The inner flange 186 of the preheat ring 132 is disposed above the outer flange 182 of the susceptor 112 to allow the susceptor 112 to be lowered relative to the preheat ring 132 for substrate loading and unloading. As shown in FIG. 1B, the inner flange 186 of the preheat ring 132 and the outer flange 182 of the susceptor 112 are spaced apart from one another (e.g., do not contact each other). In the processing position shown, a vertical gap 189 between the top surface 183 of the outer flange 182 of the susceptor 112 and the lower surface 187 of the inner flange 186 of the preheat ring 132 is about 1 mm or less, such as about 0.5 mm to about 1 mm, such as about 0.6 mm to about 0.8 mm, such as about 0.6 mm. The body 184 of the preheat ring 132 has an outer flange 190 extending below the lower surface 188. The outer flange 190 is configured to be in contact with the lower liner 130 and surround a raised portion of the lower liner 130 as described in more detail below.

The lower liner 130 has a top surface 191 at the upper end 129 facing the upper chamber volume 134. The top surface 191 is coplanar with the top surface 185 of the preheat ring 132 and the top surface 181 of the susceptor 112. The lower liner 130 has a radially inwardly extending inner flange 192 having an upper surface 193 configured to support the preheat ring 132 through the outer flange 190. The inner flange 192 has a raised portion 194 configured to fit radially within the outer flange 190 of the preheat ring 132 and configured to help retain and center the preheat ring 132 on the lower liner 130.

Figure 2A:
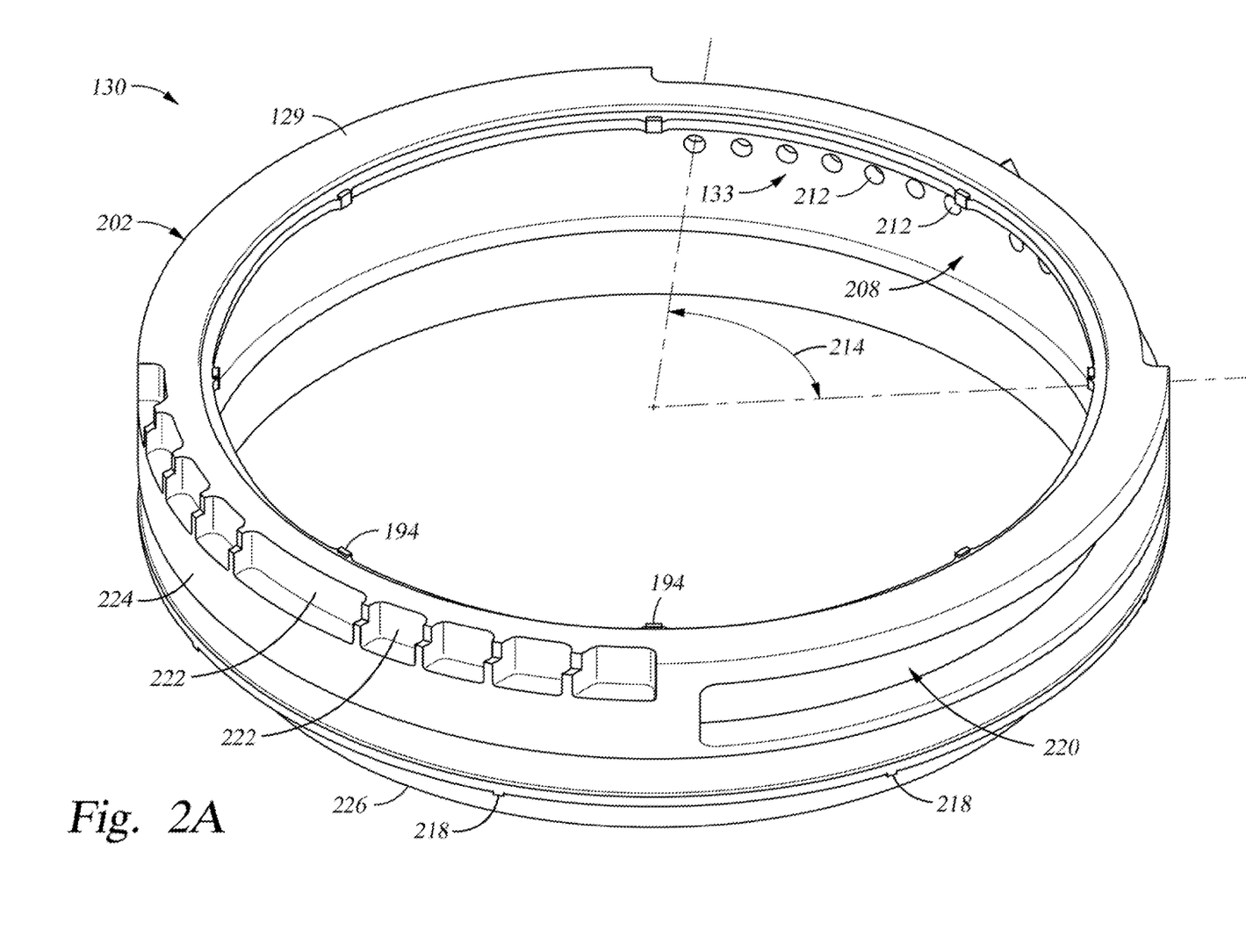
FIG. 2A is an isolated top isometric view of a lower liner, according to at least one embodiment.
Figure 2B:
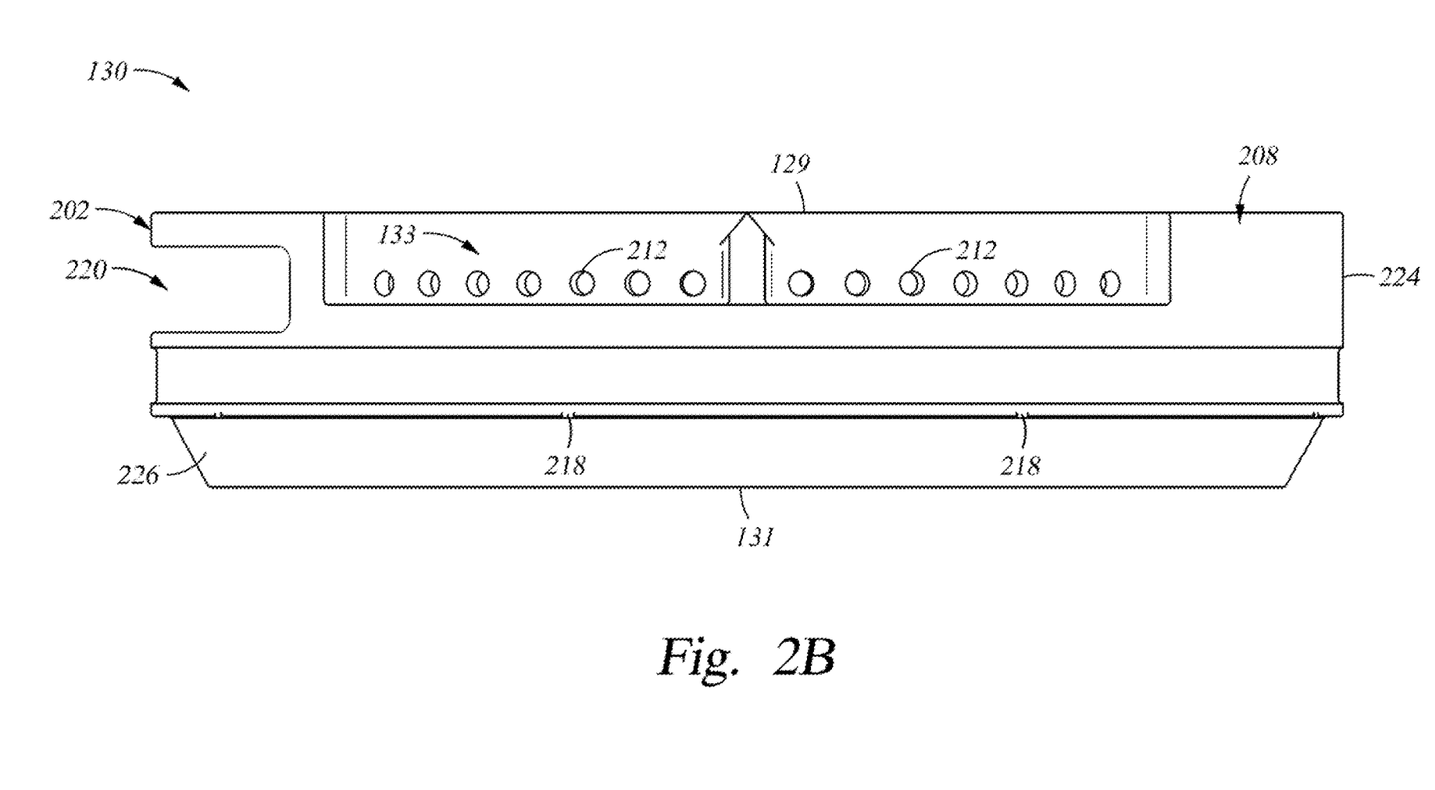
FIG. 2B is a side view of the lower liner of FIG. 2A.

FIG. 2A is an isolated top isometric view of the lower liner 130 of FIG. 1A. FIG. 2B is a side view of the lower liner 130 of FIG. 2A. FIGS. 2A and 2B are, therefore, described together herein for clarity. The lower liner 130 generally includes an annular body 202 having a first end, or upper end, 129 and an opposite second end, or lower end, 131 (shown in FIG. 2B). When the lower liner 130 is disposed in the processing chamber 100, the first end 129 is disposed in the upper chamber volume 134, and the second end 131 is disposed in the lower chamber volume 136 as shown in FIG. 1A.

A vent 133 is formed in the body 202 of the lower liner 130. The vent 133 includes one or more vent holes 212 disposed through the lower liner 130. As shown, the one or more vent holes 212 are circular. In some other examples, the one or more vent holes may be non-circular (e.g., rounded, polygonal, in the shape of elongated slots which extend lengthwise in a circumferential or longitudinal direction with respect to the lower liner, any other suitable shape, or combinations thereof). In some examples, the same lower liner may include a combination of different vent holes (e.g., a combination of circular holes and elongated slots). The one or more vent holes 212 shown extend radially through a sidewall 208 of the lower liner 130. Alternatively, the one or more vent holes 212 may extend laterally through the sidewall 208 and may be parallel to each other. The lower liner 130 shown has 14 vent holes. However, the lower liner 130 may have any suitable number of vent holes needed for exhausting purge gas from the lower chamber volume 136. The one or more vent holes 212 are circumferentially aligned around the sidewall 208 of the liner 130. In one example, at least a pair of the one or more vent holes 212 are in circumferential alignment. The one or more vent holes 212 are disposed within an arc-shaped portion of the lower liner 130. For example, the one or more vent holes 212 may be disposed within a radial angle 214 of the liner 130. The radial angle 214 may be about 90° or less, such as about 45° or less, such as about 30° to about 60°, such as about 45°.

The lower liner 130 shown has eight raised portions 194 disposed circumferentially around the lower liner 130 at equal intervals. However, the lower liner 130 may have any suitable number of raised portions 194 needed to help retain and center the preheat ring 132 on the lower liner 130 as shown in FIG. 1B.

The lower liner 130 includes a plurality of tabs 218 disposed circumferentially around an outer surface 224 of the lower liner 130. The plurality of tabs 218 are configured to rest on the lower window 110 to provide a vertical gap between the lower window 110 and a conical portion 226 of the lower liner 130 for fluidly coupling the distribution channel 152 to the second channel 154 as shown in FIG. 1A.

The lower liner 130 has an opening 220 in the sidewall 208 for substrate loading and unloading. The lower liner 130 has a plurality of recesses 222 configured to form at least a portion of the process gas inlet 140 (shown in FIG. 1A). The plurality of recesses 222 are formed in the first end 129 and the outer surface 224. The plurality of recesses 222 are fluidly coupled to each other. The plurality of recesses 222 are disposed circumferentially opposite from the vent 133.

Figure 3:
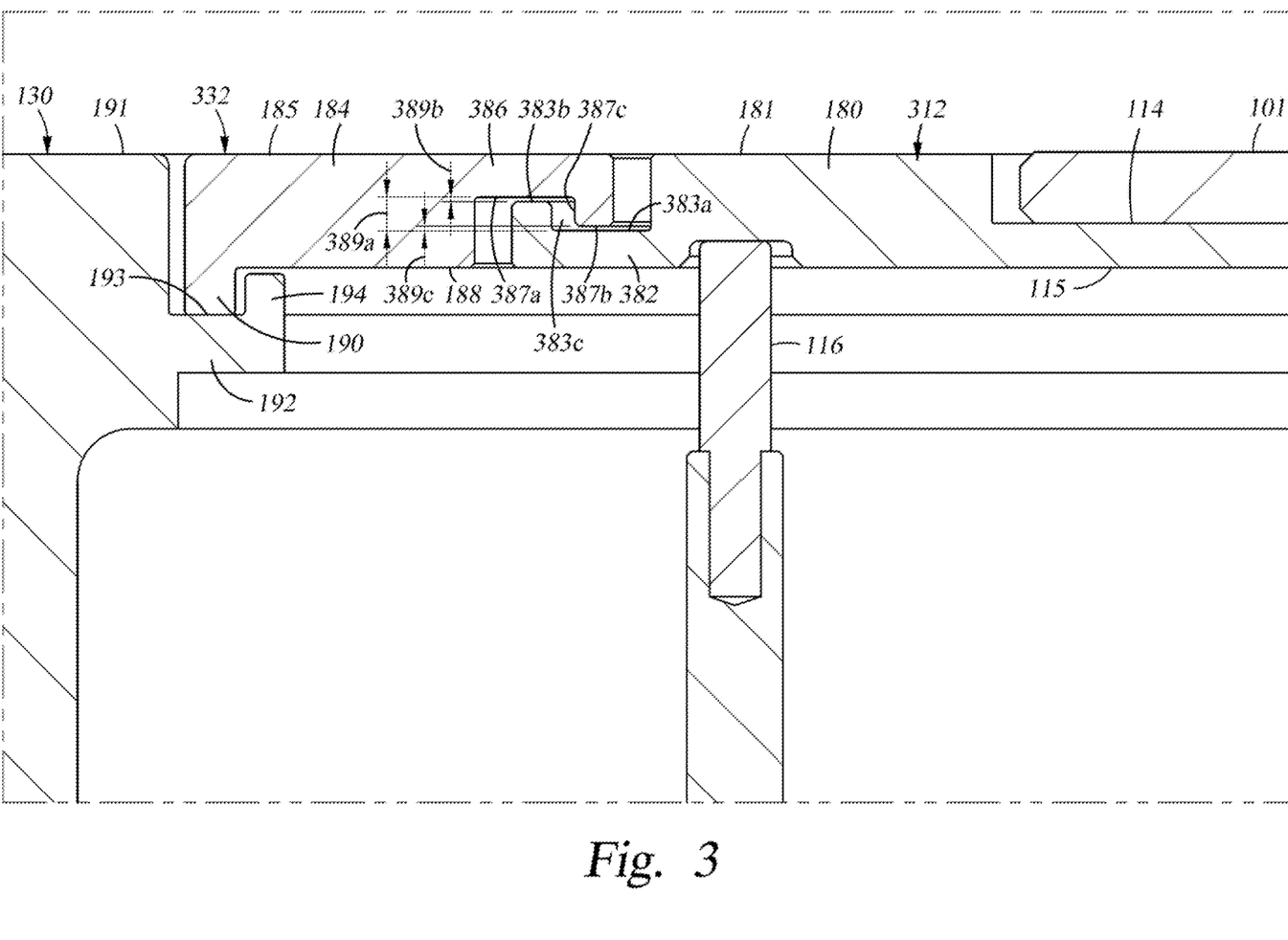
FIG. 3 is an enlarged cross-sectional view of a different susceptor and preheat ring combination that may be used in the processing chamber of FIG. 1A.

FIG. 3 is an enlarged cross-sectional view of a different susceptor and preheat ring combination that may be used in the processing chamber 100 of FIG. 1A. The susceptor 312 and preheat ring 332 are similar to that shown in FIG. 1B with the exception of the overlapping portions. Therefore, structures and corresponding labels for the non-overlapping portions are retained from FIG. 1B. In contrast to FIG. 1B, an outer flange 382 of the susceptor 312 and an inner flange 386 of the preheat ring 332 overlap in a radial direction in addition to overlapping in the vertical direction as shown in FIG. 1B.

In FIG. 3, the outer flange 382 of the susceptor 312 has a first upper surface 383a and a second upper surface 383b which extends above an elevation of the first upper surface 383a. The first upper surface 383a and second upper surface 383b shown are parallel to a plane of the susceptor 312. However, in some other examples, the first upper surface 383a and second upper surface 383b may be positioned at an acute or obtuse angle relative to the plane of the susceptor 312. An inner surface 383c connects the first upper surface 383a and second upper surface 383b. The inner surface 383c shown is perpendicular to the plane of the susceptor 312. However, in some other examples, the inner surface 383c may be positioned at an acute or obtuse angle relative to the plane of the susceptor 312.

Also in FIG. 3, the radially inwardly extending inner flange 386 of the preheat ring 332 has a first lower surface 387a and second lower surface 387b which extends below an elevation of the first lower surface 387a. The first lower surface 387a and second lower surface 387b shown are parallel to a plane of the preheat ring 332. However, in some other examples, the first lower surface 387a and second lower surface 387b may be positioned at an acute or obtuse angle relative to the plane of the preheat ring 332. An outer surface 387c connects the first lower surface 387a and second lower surface 387b. The outer surface 387c shown is perpendicular to the plane of the preheat ring 332. However, in some other examples, the outer surface 387c may be positioned at an acute or obtuse angle relative to the plane of the preheat ring 332. As shown, the profile of the inner flange 386 is shaped to conform to the profile of the outer flange 382 such that a path is formed which further impedes gas flow compared to the example shown in FIG. 1B. In some examples, the gas flow path in FIG. 3 may be referred to as a "tortuous path". In some examples, additional overlapping surfaces may be included in the overlapping portions of the susceptor 312 and preheat ring 332 following the same pattern or a different pattern.

Similar to FIG. 1B, the first upper surface 383a and the first lower surface 387a overlap in the vertical direction forming a first vertical gap 389a therebetween which may be similar in size to the vertical gap 189 in FIG. 1B. In FIG. 3, additional vertical and radial gaps are formed which impede gas flow. For example, the second upper surface 383b and the first lower surface 387a overlap in the vertical direction forming a second vertical gap 389b therebetween. In addition, the second lower surface 387b and the first upper surface 383a overlap in the vertical direction forming a third vertical gap 389c therebetween. In this example, the second vertical gap 389b and third vertical gap 389c shown are each less than the first vertical gap 389a. However, in some other examples, the second vertical gap 389b and third vertical gap 389c may be the same size or greater than the first vertical gap 389a. In this example, the second vertical gap 389b and third vertical gap 389c shown are the same size. However, in some other examples, the second vertical gap 389b and third vertical gap 389c may be different sizes. In addition, the inner surface 383c and the outer surface 387c overlap in the radial direction. In some examples, a radial gap formed therebetween may be greater in size than the vertical gap 189 in FIG. 1B in order to prevent contact between the opposing surfaces. Beneficially, the susceptor and preheat ring combination shown in FIG. 3 may further impede gas flow between chamber volumes above and below a plane of the susceptor compared to the combination shown in FIG. 1B while still allowing the susceptor to be lowered relative to the preheat ring for substrate loading and unloading.

While the foregoing is directed to embodiments of the present invention, other and further embodiments of the invention may be devised without departing from the basic scope thereof, and the scope thereof is determined by the claims that follow.

What is claimed is:

1. An assembly for a processing chamber, comprising:
   a susceptor, the susceptor comprising:
      a substrate-receiving top surface;
      a raised border radially outward of and surrounding the substrate-receiving top surface, the raised border having a top surface; and
      an outer flange;
   a liner radially outwardly of and surrounding a first volume below a plane of the susceptor; and
   a preheat ring coupled to and extending radially inwardly from the liner and radially overlapping the susceptor, wherein:
   an inner flange of the preheat ring radially overlaps the outer flange of the susceptor; and
   a lower surface of the inner flange of the preheat ring is spaced apart vertically from a top surface of the outer flange of the susceptor.

2. The assembly of claim 1, wherein radially overlapping portions of the preheat ring and the susceptor are spaced apart vertically from one another, wherein the top surface of the raised border of the susceptor, a top surface of the preheat ring, and a top surface of the liner are substantially coplanar with each other.

3. The assembly of claim 1, wherein a radially overlapping portion of the lower surface of the inner flange of the preheat ring is disposed above a radially overlapping portion of the top surface of the outer flange of the susceptor.

4. The assembly of claim 1, wherein a vertical gap between a radially overlapping portion of the lower surface of the inner flange of the preheat ring and the top surface of the outer flange of the susceptor is about 1 mm or less.

5. The assembly of claim 1, wherein the preheat ring comprises:
   an annular body, comprising:
      the inner flange which is radially inwardly extending and configured to overlap the outer flange of the susceptor which is radially outwardly extending; and
      an outer flange of the preheat ring extending below a lower surface of the preheat ring annular body; and
   an inner flange of the liner, the inner flange of the liner comprising:
      an upper surface configured to support the outer flange of the preheat ring; and
      a raised portion configured to fit radially within the outer flange of the preheat ring, wherein the outer flange of the preheat ring is configured to be in contact with the liner.

6. The assembly of claim 1, wherein the liner comprises:
   an annular body having a sidewall;
   a vent formed in the annular body for exhausting gas from inside to outside the annular body, wherein the vent comprises one or more vent holes disposed through the sidewall; and
   an opening in the annular body for substrate loading and unloading.

7. An assembly for a processing chamber, comprising:
   a susceptor, comprising:
      a substrate-receiving top surface;
      a raised border radially outward of and surrounding the substrate-receiving top surface; and
      an outer flange, the outer flange extending radially outwardly in relation to the raised border;
   a liner radially outward of and surrounding a first volume below a plane of the susceptor; and
   a preheat ring coupled to and extending radially inwardly from the liner, the preheat ring comprising:
      an inner flange, the inner flange being spaced apart horizontally from the raised border and radially overlapping the outer flange of the susceptor, wherein the outer flange of the susceptor is horizontally spaced apart from the preheat ring; and
      a lower surface of the inner flange of the preheat ring spaced apart vertically from a top surface of the outer flange of the susceptor.

8. The assembly of claim 7, wherein the lower surface of the inner flange of the preheat ring is disposed above the top surface of the outer flange of the of the susceptor.

9. The assembly of claim 7, wherein a vertical gap between the lower surface of the inner flange of the preheat ring and the top surface of the outer flange of the susceptor are about 1 mm or less.

10. The assembly of claim 7, further comprising:
    an outer flange of the preheat ring extending below a lower surface of the preheat ring; and
    an inner flange of the liner, the inner flange of the liner comprising:
       an upper surface configured to support the outer flange of the preheat ring; and
       a raised portion configured to fit radially within the outer flange of the preheat ring, wherein the outer flange of the preheat ring is configured to be in contact with the liner.

11. An assembly for a processing chamber, comprising:
    a susceptor having a substrate-receiving top surface and an outer flange;
    a preheat ring coupled to and extending radially inwardly from a liner, the preheat ring comprising:
       an outer flange of the preheat ring extending below a lower surface of the preheat ring; and
    the liner radially outward of and surrounding a first volume below a plane of the susceptor, the liner comprising:
       an inner flange of the liner, the inner flange of the liner comprising:
          an upper surface configured to support the outer flange of the preheat ring; and
          a raised portion configured to fit radially within the outer flange of the preheat ring, wherein the outer flange of the preheat ring is configured to be in contact with the liner.

12. The assembly of claim 11, further comprising:
    an inner flange of the preheat ring radially overlapping the outer flange of the susceptor; and
    a lower surface of the inner flange of the preheat ring spaced apart vertically from a top surface of the outer flange of the susceptor.

13. The assembly of claim 12, wherein the lower surface of the inner flange of the preheat ring is disposed above the top surface of the outer flange of the of the susceptor.

14. The assembly of claim 12, wherein a vertical gap between the lower surface of the inner flange of the preheat ring and the top surface of the outer flange of the susceptor are about 1 mm or less.

15. The assembly of claim 11, further comprising:
    a raised border of the susceptor radially outward of and surrounding the substrate-receiving top surface, the raised border having a top surface, wherein the outer flange of the susceptor extends radially outwardly from the raised border.

16. The assembly of claim 15, wherein the top surface of the raised border of the susceptor, a top surface of the preheat ring, and a top surface of the liner are substantially coplanar with each other.

\* \* \* \* \*